United States Patent
Tomasini et al.

Patent Number: 5,552,747
Date of Patent: Sep. 3, 1996

[54] DRIVER CIRCUIT COMPATIBLE WITH LOW SUPPLY VOLTAGES

[75] Inventors: Luciano Tomasini, Monza; Rinaldo Castello, Arcore; Pierangelo Confalonieri, Canonica D'Adda, all of Italy

[73] Assignee: SGS-Thomson Microelectronics S.r.l., Agrate Briarza, Italy

[21] Appl. No.: 457,759

[22] Filed: Jun. 1, 1995

Related U.S. Application Data

[63] Continuation of Ser. No. 125,644, Sep. 23, 1993, abandoned.

[30] Foreign Application Priority Data

Sep. 23, 1992 [EP] European Pat. Off. .............. 92830513

[51] Int. Cl.⁶ ........................... G05F 1/10; G05F 3/02
[52] U.S. Cl. ............................ 327/536; 327/541
[58] Field of Search ............................ 307/571, 572, 307/573, 585, 576, 592, 270; 327/109, 176, 211, 214, 391, 530, 536, 540, 541

[56] References Cited

U.S. PATENT DOCUMENTS

| | | | |
|---|---|---|---|
| 4,583,157 | 4/1986 | Kirsch | 363/60 |
| 4,736,121 | 4/1988 | Cini | 327/536 |
| 4,972,377 | 11/1990 | Lee | 365/226 |
| 5,170,072 | 12/1992 | Ihara | 307/264 |
| 5,264,736 | 11/1993 | Jacobson | 307/246 |
| 5,276,357 | 1/1994 | Cripe | 307/571 |
| 5,394,365 | 2/1995 | Tsukikawa | 327/536 |
| 5,426,334 | 6/1995 | Skovmand | 327/536 |

FOREIGN PATENT DOCUMENTS

| | | | |
|---|---|---|---|
| 0335217 | 4/1989 | European Pat. Off. . | |
| 2162159 | 7/1973 | France . | |
| 2220027 | 9/1987 | Japan | 327/536 |

*Primary Examiner*—William L. Sikes
*Assistant Examiner*—Tiep H. Nguyen
*Attorney, Agent, or Firm*—Robert Groover; Betty Formby

[57] ABSTRACT

A driver circuit, for an electronic switch which is to be operated from a clock signal, comprises an inverter driven by the clock signal, and a voltage doubler which is connected to supply the inverter and connected to be driven by the complementary clock signal.

28 Claims, 1 Drawing Sheet

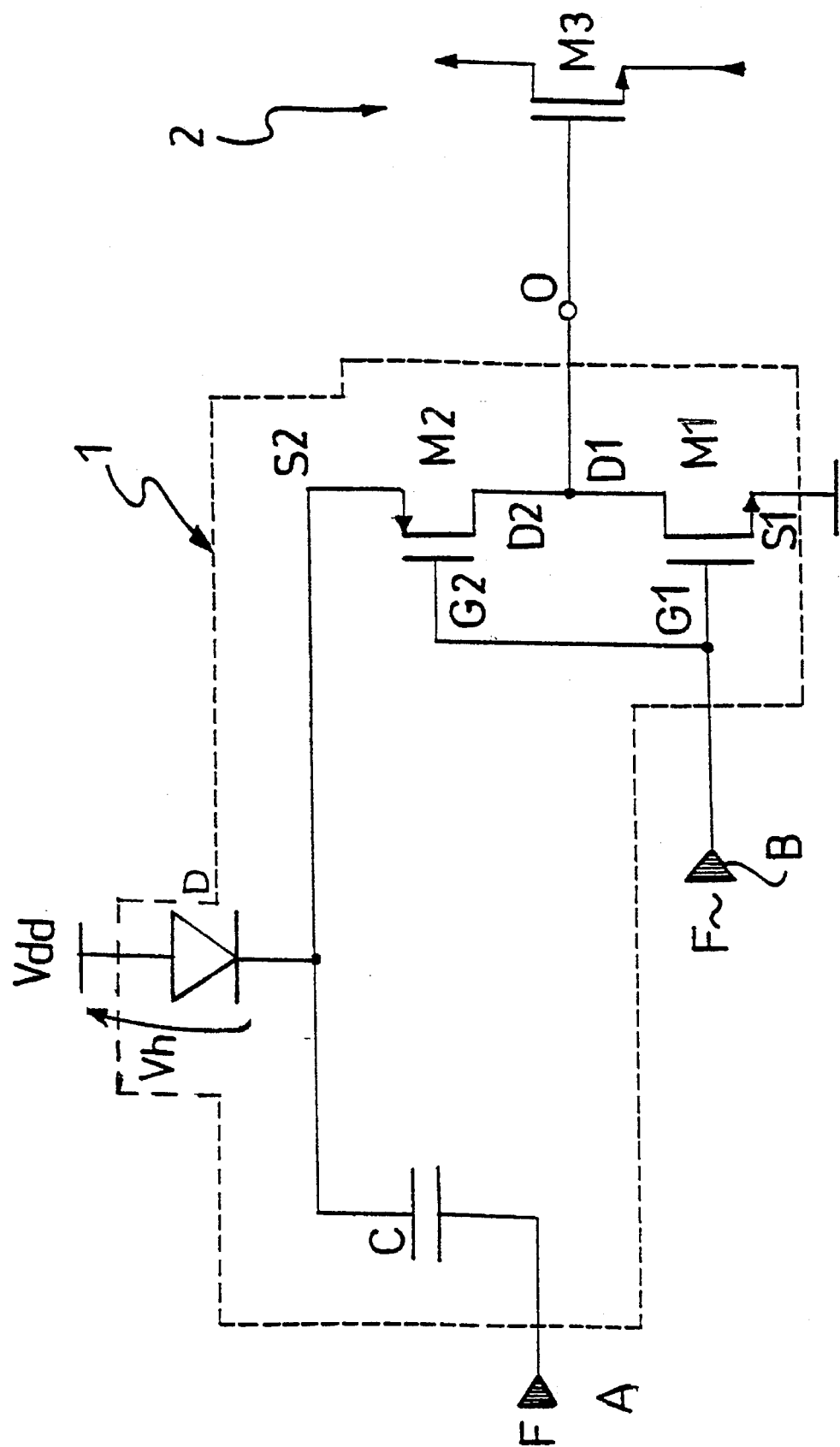

DRIVER CIRCUIT COMPATIBLE WITH LOW SUPPLY VOLTAGES

This is a continuation of application Ser. No. 08/125,644, filed Sep. 23, 1993 now abandoned.

CROSS-REFERENCE TO RELATED APPLICATION

This application claims priority from EPC App'n 92830513.5, filed 09/23/92, which is hereby incorporated by reference.

BACKGROUND AND SUMMARY OF THE INVENTION

This invention relates to a driver circuit for an electronic switch which is to be operated from a clock signal having a predetermined frequency. The field of application of this invention is particularly, but not exclusively, related to that of field-effect transistor (FET) driving. Although the present invention will be discussed in the context of a low-voltage CMOS system, it should be appreciated and understood by one skilled in the art that a wide variety of other integrated circuit and system implementations can advantageously incorporate the claimed innovative teachings.

BACKGROUND: LOW-VOLTAGE CMOS LOGIC

In conventional electronic circuits integrated on semiconductors, the transistors are often called upon to interrupt flowing currents. In such applications, the transistors are viewed as switches adapted to be operated by clock signals at either fixed or variable frequencies. Where such transistors are of the field-effect MOS type, in order to have the switch close, or "make" the circuit, the value of the gate/source voltage $V_{GS}$ should exceed by a few hundred millivolts the threshold voltage $V_T$ as boosted by the so-called "body effect." It often happens that, in order to maximize the available dynamic range, two paired MOS transistors of opposite conductivity types are used in parallel.

A typical application is in switched capacitor filters. Such transistor pairs generally comprise an N-channel MOS transistor connected to a P-channel MOS transistor. These are both driven by a voltage signal which may vary between a maximum supply value $V_{DD}$ (e.g. 5 V or 3.3 V) and a zero value. When the signal voltage is close to zero, only the P-channel transistor is in operation; conversely, when the signal voltage is close to the maximum value $V_{DD}$, the N-channel transistor only is in operation; and when the signal has a value of $V_{DD}/2$, both transistors are in operation.

On the other hand, in a typical low-voltage CMOS system, the supply voltage can be less than the sum of the threshold voltages of both transistors:

$$V_{DD} < |V_{TN}| + |V_{TP}|$$

Taken together and inclusive of the body effect, there will be voltages at which neither transistor can be turned on and, therefore, that no switch can be controlled to "make." This would particularly occur across a range of voltage values lying centrally with respect to the maximum value $V_{DD}$.

To clarify this, consider the voltage transfer characteristics for a conventional CMOS inverter. Assume that the supply voltage $V_{DD}$ is (for example) approximately 5 Volts, and the PMOS threshold $V_{TP}$ and NMOS threshold voltage $V_{TN}$ both have magnitudes in the range of about 0.9 V. When the input voltage $V_{IN}$ is initially at ground voltage $V_{SS}$ (0 V), the inverter's NMOS transistor is off and the inverter's PMOS transistor is on. The output is therefore at $V_{DD}$. As $V_{IN}$ starts to rise, $V_{OUT}$ will stay at $V_{DD}$ until $V_{IN}$ rises to $V_{TN}$. At this point the NMOS device will start to pass current. However, the NMOS device will not be able to overpower the PMOS device until the voltage reaches a trip point $V_{TRIP}$.[1] As the input voltage $V_{IN}$ increases beyond $V_{TRIP}$, the NMOS device will pass more current and the PMOS device will pass less current, so that the output is pulled toward ground. At voltage $V_{DD}-V_{TP}$ the PMOS transistor turns off. Thus for every input voltage the output is loaded by the NMOS and/or the PMOS, so that the output is never in a high-impedance (floating) condition.

[1] The trip point voltage $V_{TRIP}$ is well-defined for each particular logic gate, but is dependent on the device dimensions. If the width of the PMOS device is increased, or the length of the PMOS device decreased, or the width of the NMOS device is decreased, or the length of the NMOS device increased, then the NMOS device will have more difficulty in overpowering the PMOS device, and the trip point $V_{TRIP}$ will occur at a higher voltage. would, therefore, affect the signal-to-noise ratio adversely, since the dynamic range, which has been diminished already by the low supply value, would be further reduced by so doing.

Now suppose instead that the supply voltage $V_{DD}$ is only 1.5 V, and the threshold voltages are still $|V_{TP}|=|V_{TN}|=0.9$ V. When the input voltage VIN increases above $V_{DD}-V_{TP}$ (0.6 V in this example), the PMOS device will turn off, but the NMOS device would not yet have turned on. Therefore, until the input voltage increases to $V_{TN}$ (0.9 V in this example,), the switch will remain open, and the output node will be floated. This high-impedance condition is undesirable in many applications To obviate any such drawbacks, one might consider shifting the signal range of values more toward $V_{DD}$ (in which case, P-type transistors would only be used) or toward zero (when N-type transistors would only be used). However, shifting the common mode value of a signal upwards or downwards from the supply value $V_{DD}$ results in the dynamic range of the signal being reduced. Such an approach Another conventional approach provides for the threshold voltages of the MOS transistors to be lowered so that the conditions for potential appearance of the problem can be avoided, i.e. so that the low supply voltage is greater than the combined thresholds (plus the body effect). However, not even the latter solution is always practicable because it clashes with the operational requirements of the transistors which, if arranged to have a threshold $V_T$ below a certain value, can no longer perform as intended, especially where they are to operate under varying conditions of temperature and voltage.

The disclosed inventions provide a driver for an electronic switch, which has such structural and functional features as to overcome the above-mentioned drawbacks with which the prior art approaches are beset. A significant solutive idea on which the invention stands is the realization that it can be advantageous to recognize that it is not necessary to multiply the driving voltage of the clock signals by high factors, it being sufficient to have it raised by a factor of two. Based on this solutive idea, the technical problem is solved by a driver circuit of the present invention.

The features and advantages of a circuit according to the invention will become apparent from the following detailed description of an embodiment thereof, given by way of example and not of limitation in connection with an associated impedance synthesizing circuit illustrated in the accompanying drawing.

According to one class of innovative embodiments there is provided: A clocked switch, in a CMOS integrated circuit, comprising: a voltage doubler circuit, connected to be pumped by a first clock signal, and connected to provide a boosted positive voltage whenever said first clock signal is at a high level; a CMOS logic gate, connected to be powered by said boosted voltage, and connected to receive, as a signal input, a second clock signal which is different from said first clock signal; and at least one switching transistor, having a gate connected to be driven by said output node of said logic gate.

According to another class of innovative embodiments there is provided: A clocked switch, in a CMOS integrated circuit, comprising: a voltage booster circuit, connected to be pumped by a first clock signal, and connected to provide a boosted positive voltage whenever said first clock signal is at a high level; a CMOS logic gate, comprising a P-channel transistor connected between said boosted positive voltage and an output node, and an N-channel transistor connected to pull down said output node; said transistors of said logic gate both having gates connected to receive a second clock signal which is different from said first clock signal; and an N-channel transistor, having a gate connected to be driven by said output node of said logic gate; whereby said N-channel transistor is reliably switched on whenever said first clock signal goes high while said second clock signal is low.

According to another class of innovative embodiments there is provided: A clocked switch, in an integrated circuit, comprising: a capacitor connected to receive, on a first terminal thereof, a first clock signal signal; said capacitor also having a second terminal which is connected through at least one diode to an externally received supply voltage; whereby said capacitor provides a boosted positive voltage on said second terminal thereof whenever said first clock signal goes to a high level; a CMOS logic gate, comprising a P-channel transistor operatively connected to pull an output node toward the voltage of said second terminal of said capacitor, and an N-channel transistor connected to pull down said output node, said transistors both having gates connected to receive a second clock signal which is different from said first clock signal; and an N-channel transistor, having a gate connected to be driven by said output node of said logic gate; whereby said N-channel transistor is reliably switched on whenever said first clock signal goes high while said second clock signal is low.

According to another class of innovative embodiments there is provided: A driver circuit for an electronic switch, comprising: a logic gate connected to be driven by a first signal; a capacitor connected to receive, on a first terminal thereof, a second signal which is substantially complementary to said first signal; said capacitor also having a second terminal which is connected to supply said logic gate and which is also connected through at least one diode to an externally received supply voltage.

According to another class of innovative embodiments there is provided: A driver circuit for an electronic switch operated from first and second non-overlapping clock signals having a common predetermined frequency, comprising: a logic gate having a signal input connected to receive said first clock signal; and a voltage doubler connected to be pumped by said second clock signal, and to provide a pumped voltage to power said logic gate.

BRIEF DESCRIPTION OF THE DRAWING

The present invention will be described with reference to the accompanying drawings, which show important sample embodiments of the invention and which are incorporated in the specification hereof by reference, wherein:

FIG. 1 is a schematic diagram illustrating an embodiment of this invention in a driver circuit for an electronic switch.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIG. 1 generally and schematically shows a driver circuit 1 for an electronic switch 2. In particular, circuit 1 operates switch 2 according to a clock signal F having a predetermined frequency. Switch 2 comprises an N-channel MOS transistor M3 whose gate is connected to the circuit 1 output O, while its drain and source form the switch terminals.

Driver circuit 1 includes an output circuit portion implemented with a pair of field-effect transistors M1 and M2 connected to each other. Specifically, these transistors are of the MOS type and have their respective drain terminals D1, D2 in common. The drain terminals D1 and D2 also coincide with the output O of the circuit 1. The first, M1, of such transistors is an N-channel type and has its source terminal S1 connected to ground. The second transistor, M2, is of the P-channel type and has its source terminal S2 connected to a first input pin A of circuit 1 through a capacitor C. Source terminal S2 is also connected, via a diode D, to a constant voltage supply $V_{DD}$. The diode D is forward biased to the supply VDD. Further, transistors M1 and M2 have their respective gate terminals G1, G2 connected together and to a second input pin B. The input pins A and B are applied periodic clock voltage signals having respective phases F and F/ which are generated within the voltage range of values 0–$V_{DD}$. The phases have comparatively small amplitudes due, in fact, to their variance between zero and the supply value VDD. Additionally, the phases are "non-overlapping" as they never take the value of $V_{DD}$ simultaneously. This "non-overlapping" feature is specially important for proper performance of circuit 1.

Basically, circuit 1 behaves as a voltage doubler for the clock signal. For illustrative purposes, the operation of circuit 1 can be described with reference to an initial state wherein phase F at input pin A is low (0 V) and phase F/ at input pin B is high ($V_{DD}$). Under these starting conditions, the output O would be at zero volts because the first MOS transistor M1 is conducting, it having a gate-to-source voltage drop equal to the supply voltage $V_{DD}$. The other transistor M2 is shut down since it has the drain D2 and source S2 both at a lower voltage level than the gate G2.

In the meantime, the capacitor C has been charged, by a current flowing through the diode D, to a pre-charging voltage $V_C$ equal to $V_{DD}$-$V_h$, where $V_h$ is the voltage drop across the diode D. Upon depletion of the charging transient of the capacitor C, the voltage drop Vh will become quite small, as is also the current being flowed through the diode. Upon the phase F/ attaining zero value, the first transistor M 1 will be shut down, whereas the second transistor M2 is turned on to pre-charge the output O to a value of $V_{DD}$-$V_h$. The other phase F rises after a short delay up to the value of $V_{DD}$, and the upper plate of the capacitor C is almost instantaneously applied a voltage being the sum $V_C+V_{DD}$. This voltage is nearly twice the supply voltage $V_{DD}$. The diode D is reverse biased.

If we now denote by $C_t$ the overall capacitance as seen from the output 0, said overall capacitance also encompassing all the parasitic capacitors associated with the transistors and the diode D, we can find the value of the output voltage $V_o$ as follows, $$V_o=V_c+C*V_{DD}/(C+C_t)$$

The second term of the sum is due to the capacitive division of circuit 1.

The clock signal cycle is completed on the phase F returning to zero and the other phase F returning to the value of $V_{DD}$. This will restore circuit 1 to its starting condition with the output 0 at zero value.

Advantageously, the capacitance C can be quite small, since the first rise period of the output voltage $V_o$ is provided directly by the voltage supply $V_{DD}$. The capacitor C would only be operative during the final portion of the transient.

The second, P-channel, MOS transistor can also have a smaller area than in conventional solutions because all of the possible gate-to-source voltage is made available to it. The circuit of this invention solves the technical problem and affords a number of advantages, including, but not limited to that the output O will be at its maximum voltage value from the first clock cycle, and that the circuit requires no start-up time in order to be brought to steady state operation.

Furthermore, it should be recognized that the circuit of the invention is also applicable to other low-voltage logic circuits where the clock signals are not too slow.

For illustrative purposes only, some examples of sample design dimensions follow. The actual dimensions used will vary according to the load carried, i.e. the number of switches 2 and the actual output sought.

M1 W/L=5/2 μm
M2 W/L=15/2 μm
D W/L=3.6/3.6 μm
C=5 pF or 20 pF (varied according to load)
F, F/=1MHz, 32 kHz or 64 kHz.

In various sample implementations the clock signal may have a frequency in the range of about 1 KHz to about 3 MHz inclusive, or more specifically in the range of about 30 KHz to about 1 MHz inclusive.

In various sample implementations the capacitor value may fall in the range of 3–50 pF.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the disclosed circuit can be operated at even lower frequencies (down to frequencies at which, with a period of milliseconds, leakage of the capacitor becomes a problem).

The disclosed inventions are most particularly advantageous where a clock phase is being used to drive a transistor, and a non-overlapping clock phase is available to provide the pumping signal. However, the innovative circuit can also be applied to other signals, as long as a certain maximum duration between cycles of the pumping signal is assured.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A clocked switch, in a CMOS integrated circuit, comprising:

a charge-pumping voltage doubler circuit, connected to be pumped by a first clock signal, and connected to provide therefrom a boosted positive voltage whenever said first clock signal is at a high level, said boosted voltage being greater than the maximum voltage of said first clock signal;

a CMOS logic gate, connected to be powered by said boosted voltage, and connected to receive, as a signal input, a second clock signal which is substantially complementary to said first clock signal; and at least one switching transistor, having a gate connected to be driven by an output node of said logic gate.

2. The switch of claim 1, wherein said logic gate consists of a single P-channel transistor in series with a single N-channel transistor, with a node therebetween being connected to provide an output.

3. The switch of claim 1, wherein said first clock signal has a frequency in the range of about 30 KHz to about 1 MHz inclusive.

4. The switch of claim 1, wherein said first clock signal has a frequency in the range of about 1 KHz to about 3 MHz inclusive.

5. The switch of claim 1, wherein said first and second clock signals are non-overlapping.

6. A clocked switch, in a CMOS integrated circuit, comprising:

a charge-pumping voltage doubler circuit, connected to be pumped by a first clock signal, and connected to provide a boosted positive voltage whenever said first clock signal is at a high level;

a CMOS logic gate, connected to be powered by said boosted voltage and connected to receive, as a signal input, a second clock signal which is different from said first clock signal; and at least one switching transistor, having a gate connected to be driven by said output node of said logic gate;

wherein said voltage doubler circuit consists of a single capacitor and a single diode interconnected to provide charge pumping through said diode and said capacitor.

7. A clocked switch, in a CMOS integrated circuit, comprising:

a charge-pumping voltage booster circuit, connected to be pumped by a first clock signal, and connected to provide a boosted positive voltage whenever said first clock signal is at a high level;

a CMOS logic gate, comprising a P-channel transistor connected between said boosted positive voltage and an output node, and an N-channel transistor connected to pull down said output node; said transistors of said logic gate both having gates connected to receive a second clock signal which is different from said first clock signal; and an N-channel transistor, having a gate connected to be driven by said output node of said logic gate;

whereby said N-channel transistor is reliably switched on whenever said first clock signal goes high while said second clock signal is low.

8. The switch of claim 7, wherein said logic gate consists of said P-channel transistor and said N-channel transistor.

9. The switch of claim 7, wherein said first clock signal has a frequency in the range of about 30 KHz to about 1 MHz inclusive.

10. The switch of claim 7, wherein said first clock signal has a frequency in the range of about 1 KHz to about 3 MHz inclusive.

11. The switch of claim 7, wherein said first and second clock signals are non-overlapping.

12. The switch of claim 7, wherein said voltage booster circuit consists of a single capacitor and a single diode connected to provide charge pumping through said diode and said capacitor.

13. A clocked switch, in an integrated circuit, comprising:

a capacitor connected to receive, on a first terminal thereof, a first clock signal; said capacitor also having a second terminal which is connected through at least one diode to an externally received supply voltage; whereby said capacitor provides a boosted positive voltage on said second terminal thereof whenever said first clock signal goes to a high level;

a CMOS logic gate, comprising a P-channel transistor operatively connected to pull an output node toward the voltage of said second terminal of said capacitor, and an N-channel transistor connected to pull down said output node, said transistors both having gates connected to receive a second clock signal which is different from said first clock signal; and an N-channel transistor, having a gate connected to be driven by said output node of said logic gate;

whereby said N-channel transistor is reliably switched on whenever said first clock signal goes high while said second clock signal is low.

14. The switch of claim 13, wherein said logic gate consists of said P-channel transistor and said N-channel transistor.

15. The switch of claim 13, wherein said first clock signal has a frequency in the range of about 30 KHz to about 1 MHz inclusive.

16. The switch of claim 13, wherein said first clock signal has a frequency in the range of about 1 KHz to about 3 MHz inclusive.

17. The switch of claim 13, wherein said first and second clock signals are non-overlapping.

18. A driver circuit for an electronic switch, comprising:

(a.) a logic gate connected to be driven by a first alternating signal;

(b.) a capacitor connected to receive, on a first terminal thereof, a second alternating signal which is substantially complementary to said first signal; said capacitor also having a second terminal which is connected to supply said logic gate and which is also connected through at least one diode to an externally received supply voltage.

19. The circuit of claim 18, wherein said second signal is non-overlapping with respect to said first signal.

20. The circuit of claim 18, wherein said logic gate comprises a first, N-channel, MOS transistor and a second, P-channel, MOS transistor, said transistors having drain terminals thereof connected in common to form the drive output of said circuit.

21. A driver circuit for an electronic switch, comprising:

(a.) a logic gate connected to be driven by a first alternating signal;

(b.) a capacitor connected to receive, on a first terminal thereof, a second alternating signal which is substantially complementary to said first signals said capacitor also having a second terminal which is connected to supply said logic gate and which is also connected through at least one diode to an externally received supply voltage;

wherein said logic gate comprises a first, N-channel, MOS transistor and a second, P-channel, MOS transistor connected in series.

22. A driver circuit for an electronic switch operated from first and second non-overlapping clock signals having a common predetermined frequency, comprising:

(a.) a logic gate having a signal input connected to receive said first clock signal; and (b.) a charge-pumping voltage doubler connected to be pumped by said second clock signal, and to provide therefrom a pumped voltage, which is greater than the maximum voltage of said second clock signal, to power said logic gate.

23. The circuit of claim 22, wherein said logic gate comprises a first, N-channel, MOS transistor and a second, P-channel, MOS transistor, both having gates connected to said first clock signal.

24. The circuit of claim 22, wherein said logic gate comprises a first, N-channel, MOS transistor and a second, P-channel, MOS transistor, both having gates connected to said first clock signal, and having respective drain terminals connected in common to form the drive output of said circuit.

25. A driver circuit for an electronic switch operated from first and second non-overlapping clock signals having a common predetermined frequency, comprising;.

(a.) a logic gate having a signal input connected to receive said first clock signal; and (b.) a charge-pumping voltage doubler connected to be pumped by said second clock signal, and to provide a pumped voltage to power said logic gate;

wherein said voltage doubler comprises a capacitor connected between said second clock signal and said logic gate; and a diode connected between said second clock signal and a constant voltage supply.

26. The circuit of claim 25, wherein said first clock signal has a frequency in the range of about 30 KHz to about 1 MHz inclusive.

27. The circuit of claim 25, wherein said first clock signal has a frequency in the range of about 1 KHz to about 3 MHz inclusive.

28. The circuit of claim 25, wherein said capacitor has the value in the range of 3–50 pF inclusive.

* * * * *